(12) United States Patent
Olson

(10) Patent No.: US 7,545,197 B2
(45) Date of Patent: Jun. 9, 2009

(54) ANTI-LOGARITHMIC AMPLIFIER DESIGNS

(75) Inventor: Scot Olson, Scottsdale, AZ (US)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 11/767,175

(22) Filed: Jun. 22, 2007

(65) Prior Publication Data

US 2008/0315939 A1   Dec. 25, 2008

(51) Int. Cl.
*G06F 7/64* (2006.01)
(52) U.S. Cl. ...................... 327/346; 327/334
(58) Field of Classification Search ........... 327/346, 327/150, 131, 126, 350
See application file for complete search history.

(56) References Cited

U.S. PATENT DOCUMENTS 3,849,706 A * 11/1974 Johnson et al. ............ 361/80
4,168,492 A *  9/1979 Uya ........................ 341/119

OTHER PUBLICATIONS

Olson, Scot, U.S. Appl. No. 11/756,002, filed May 31, 2007.

* cited by examiner

*Primary Examiner*—Dinh T. Le
(74) *Attorney, Agent, or Firm*—Ingrassia Fisher & Lorenz, P.C.

(57) ABSTRACT

An anti-exponential amplifier produces an output signal that is an exponential/anti-logarithmic function of an input signal. The amplifier includes three function generators and a low-pass filter. The first function generator produces a periodic exponential waveform based upon a resistor-capacitor time constant, with the magnitude of the periodic exponential waveform exponentially increasing to a maximum value in each period. A second function generator produces a ramp waveform from the exponential waveform. The ramp waveform has a period and maximum amplitude substantially equal to those of the exponential signal. The third function generator produces a hybrid waveform with a first portion and a second portion, with the duration of the first period determined in response to the ramp waveform. A low pass filter produces the anti-logarithmic output signal as a function of the hybrid waveform. The resulting amplifier could be useful in a brightness or other parameter control for a display.

16 Claims, 4 Drawing Sheets

ANTI-LOGARITHMIC AMPLIFIER DESIGNS

TECHNICAL FIELD

The present invention generally relates to amplifier circuits, and more particularly relates to amplifier circuits with anti-logarithmic amplification characteristics.

BACKGROUND

An amplifier is any device or circuit capable of increasing the voltage, current and/or power of an applied input signal. Amplifiers are well-known devices that have been used in many different electrical and electronic environments for many years. Many amplifiers are described as "linear", "exponential", "logarithmic" or the like in accordance with the shape of their output vs. input characteristics. A "logarithmic" amplifier, for example, typically produces an output signal that increases logarithmically as the input signal is increased, with an anti-logarithmic amplifier producing an output signal that increases exponentially (i.e. anti-logarithmically) with the input signal. This characteristic may be beneficial in many applications because small changes in input signal can produce relatively large or small effects upon the amplifier output, depending upon the input value. In a flat panel or other visual display, for example, it may be desirable for the brightness of the display to increase and/or decrease logarithmically or anti-logarithmically as a control knob or other input is adjusted to reflect the sensitivity of the human eye.

Typically, logarithmic and anti-logarithmic amplifiers are designed to be based upon the electronic properties of a conventional P-N junction, which is generally implemented in doped silicon or other semi-conducting material. Semiconductors can be complicated and expensive to fabricate, however, particularly for specialized environments. As a result, it is desirable to create an anti-logarithmic amplifier that can produce precise and accurate output over a range of environmental conditions but without the disadvantages inherent in amplifiers based upon the transfer characteristic of a P-N junction. It is also desirable to produce flat panel displays with improved amplifier features.

SUMMARY

An anti-exponential amplifier produces an output signal that is an exponential/anti-logarithmic function of an input signal. According to various exemplary embodiments, the amplifier includes three function generators and a low-pass filter. The first function generator produces a periodic exponential waveform based upon a resistor-capacitor time constant, with the magnitude of the periodic exponential waveform exponentially increasing to a maximum value in each period. A second function generator produces a ramp waveform from the exponential waveform. The ramp waveform has a period and maximum amplitude substantially equal to those of the exponential signal. The third function generator produces a hybrid waveform with a first portion and a second portion, with the duration of the first period determined in response to the ramp waveform. A low pass filter produces the anti-logarithmic output signal as a function of the hybrid waveform.

Other embodiments include methods for producing an anti-exponential output signal, as well as display systems incorporating anti-exponential amplifier features. The resulting amplifier could be useful in a brightness or other parameter control for a liquid crystal or other flat panel display, for example, or could be used for any other purpose.

BRIEF DESCRIPTION OF THE DRAWINGS

The present invention will hereinafter be described in conjunction with the following drawing figures, wherein like numerals denote like elements.

DETAILED DESCRIPTION

Before proceeding with the detailed description, it is to be appreciated that the described embodiments are applicable to a wide range of electrical and electronics application, and are not limited to use in conjunction with particular environments described herein. Although the present embodiment is depicted and described as being implemented in a the context of a visual display herein, for example, equivalent principles and concepts can be implemented in various other types of applications, and in various other systems and environments.

According to various exemplary embodiments, a new exponential/anti-logarithmic amplifier circuit produces an output signal as a function of a conventional resistor-capacitor (RC) time constant rather than as a function of the charge transfer characteristic of a P-N junction. Unlike most conventional RC circuits, which are highly temperature dependent, the amplifier circuits described below are capable of producing an accurate response across a range of temperatures. By properly generating and recovering the RC rise time characteristic, the temperature dependence and tolerance variation effects typically observed in conventional RC circuits can be eliminated.

In the embodiments shown and discussed herein, an effort has been made to simplify the discussion by providing "pure" anti-logarithmic output signals that are simply the exponentiated input signals without any additional scaling or processing. This unadulterated signal is produced using various scaling and signal-combining features within the circuit that may not be included in all embodiments. Stated another way, many equivalent embodiments may incorporate different amplitude scaling, signal combinations and/or the like by including different and/or additional circuitry, by using different or additional reference signals, and/or the like. Additionally, the various components shown in the figures may be logically or physically arranged with respect to each other in any manner. Equivalent embodiments may combine the difference amplifier feature with one or more function generators, for example. Many other digital, analog, discrete and/or integrated components may therefore be arranged or otherwise interconnected in any manner across a wide array of equivalent embodiments.

Figure 1:
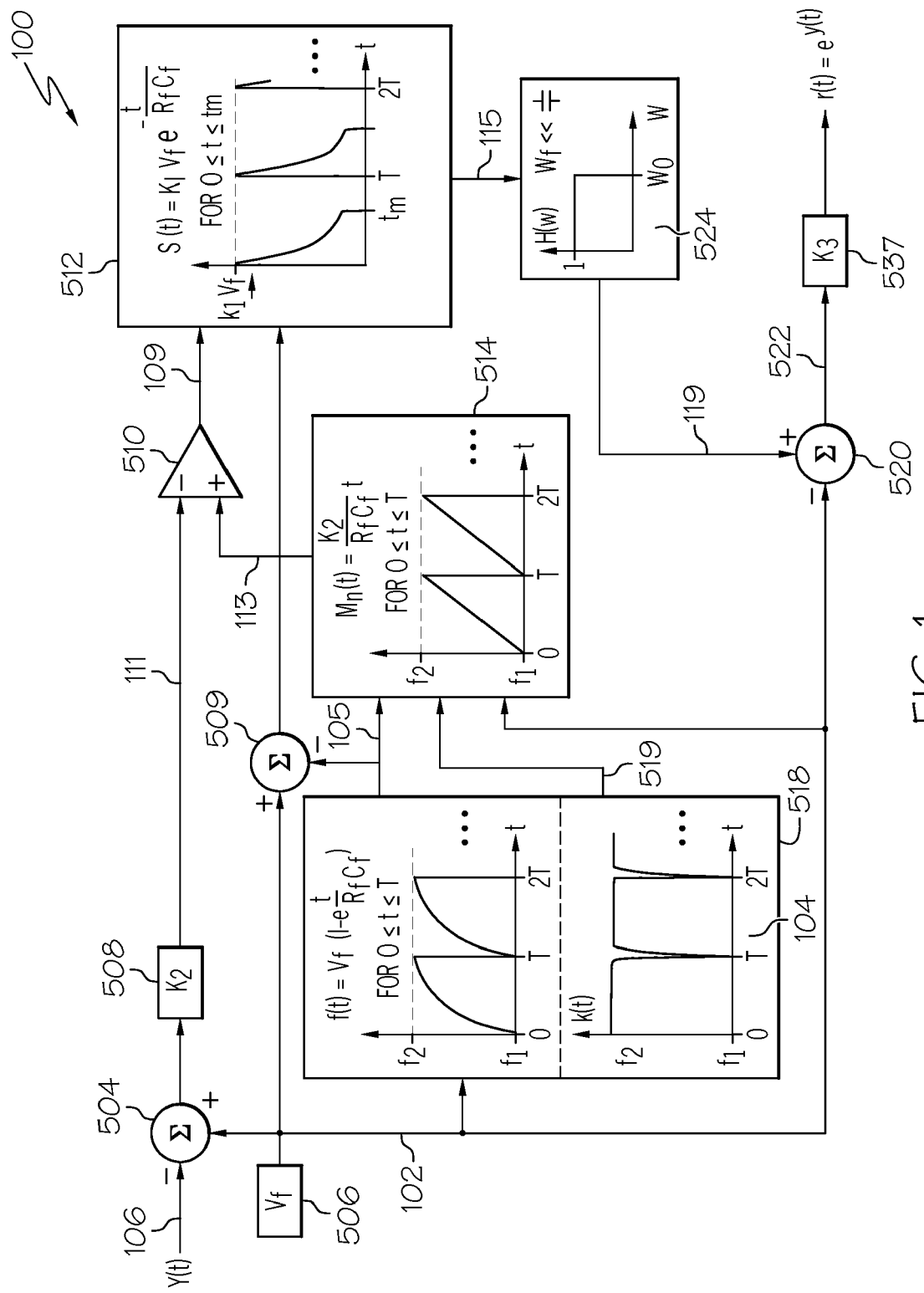
FIG. 1 is a block diagram of an exemplary anti-logarithmic amplifier.

With initial reference to FIG. 1, an exemplary anti-logarithmic amplifier 100 suitably includes a reference signal generator 506, various function generators 104, 512 and 514, and low pass filter 524. Various other signal blending or modifying features may also be provided based upon the particular embodiment and implementation. For example, scaling modules 508 and 537 may be provided along with summing junctions 509, 520 and/or difference amplifier/comparator 510, as appropriate.

Function generator 104 is any circuitry, logic or other module capable of producing a periodic exponential waveform 105 from reference signal 102. In various embodiments, reference signal 102 is a reference voltage that may be received from an external source (e.g. a battery or rail voltage) or that may be alternately processed internal to circuit 100 as appropriate. Function generator 104 suitably produces an exponential waveform 105 as a function of a resistor-capacitor (RC) rise time. That is, as reference signal 102 is applied to a resistor-capacitor circuit or network, the RC time constant of the circuit generally produces a voltage that exponentially increases with time. Function generator 104 suitably shapes exponential waveform 105 such that it repeats periodically (having a suitable period T) and such that the amplitude of the signal exponentially rises from a minimum value ($f_1$) to a maximum value ($f_2$) during each period. One technique for generating such a signal is described below in conjunction with FIGS. 2 and 3. In various further embodiments, function generator 104 also includes a node or other module 518 capable of providing a "reset" signal 519 that indicates the beginning (or end) of any new period in exponential waveform 105. Exponential waveform 105 and reset signal 519 can be used by function generator 514 to produce a ramp signal 113 that has a signal period (T) and maximum amplitude that is substantially equal to those of exponential waveform 105.

In the embodiment shown in FIG. 1, the signal y(t) 106 that is provided as a control input to amplifier 100 is suitably summed 504 with reference signal 102 and scaled 508 as appropriate to produce a scaled representation 111 of input signal 106. Scaled representation 111 may be generated in any manner. For example, scaling 508 may be accomplished using any sort of amplifier (e.g. an operational amplifier) or attenuation circuit, voltage divider circuit, or any other sort of analog and/or digital circuitry. Other embodiments may incorporate any sort of scaling, signal combining or other processing as appropriate, or may eliminate signal processing/scaling entirely.

Function generator 512 is any circuit, logic or other module that produces a periodic output signal 115 that includes a first waveform for a first time period and a second waveform different from the first waveform for the remainder of the signal period. The period of signal 115 is shown to be the same as that of exponential waveform 105. In various embodiments, signal 115 is produced in response to a difference signal 109 that is representative of the difference between scaled representation 111 of input signal 106 and ramp signal 113. As ramp signal 113 exceeds the scaled representation 111, for example, a waveform derived from exponential waveform 105 can be provided as output 115, with a waveform having a different shape (e.g. a DC value such as zero, null or some other reference value) provided during the remainder of the signal period. In various embodiments, the function generator 512 includes or operates in conjunction with a difference amplifier or comparator 510 and the summed output 509 to produce hybrid signal 115.

Difference signal 109 thereby represents the relative time that ramp signal 113 exceeds the scaled input signal 111. As the input signal 106 is increased (e.g. in response to the user adjusting a potentiometer knob or other control), the relative portion of time in period T that the ramp signal 113 exceeds the scaled representation 111 will decrease. The time at which the two signals 111 and 113 are equal to each other is referenced herein as time $t_m$. In general, signal 115 is considered to provide a signal based upon scaled exponential signal 105 prior to time $t_m$, with $t_m$ based upon a scaled representation of input signal 106 and ramp signal 113. After time $t_m$, signal 115 is shown to provide a zero or null signal for the remainder of period T. Again, other embodiments may include radically different signaling, scaling and implementation schemes of equivalent concepts.

The hybrid output signal 115 is appropriately passed through a filter 524 to remove high frequency components, and the resulting signal 119 will provide an anti-logarithmic representation of the input signal 106 that can be scaled or otherwise processed as appropriate to provide a suitable output signal 522. Filter 524 is any low-pass filter capable of providing the direct current (DC) component of signal 115 as filtered output signal 119. Typically, a low pass filter can be designed using simple components (e.g. capacitors, resistors) to have a cutoff frequency that is below the frequency (1/T) of signal 115, thereby ensuring proper operation. In various embodiments, scaling of filtered signal 119 can be accomplished with any type of amplifier, attenuator, voltage divider or other suitable circuitry. In still other embodiments, scaling is removed entirely from amplifier 100.

Amplifier 100 provides numerous benefits over other amplifiers currently available. Rather than relying upon characteristics of a PN junction, for example, function generator 104 is able to generate a logarithmic function using a simple resistor-capacitor (RC) rise time that can be produced with simple and inexpensive discrete components. Similarly, the other components of amplifier 100 may be implemented with conventional discrete elements, further reducing the cost of such embodiments. Moreover, by generating and extracting the logarithmic characteristic in the manner described herein, the temperature dependence and other adverse affects typically associated with RC circuits can be avoided. The mathematical basis for an exemplary embodiment is provided below.

Figure 2:
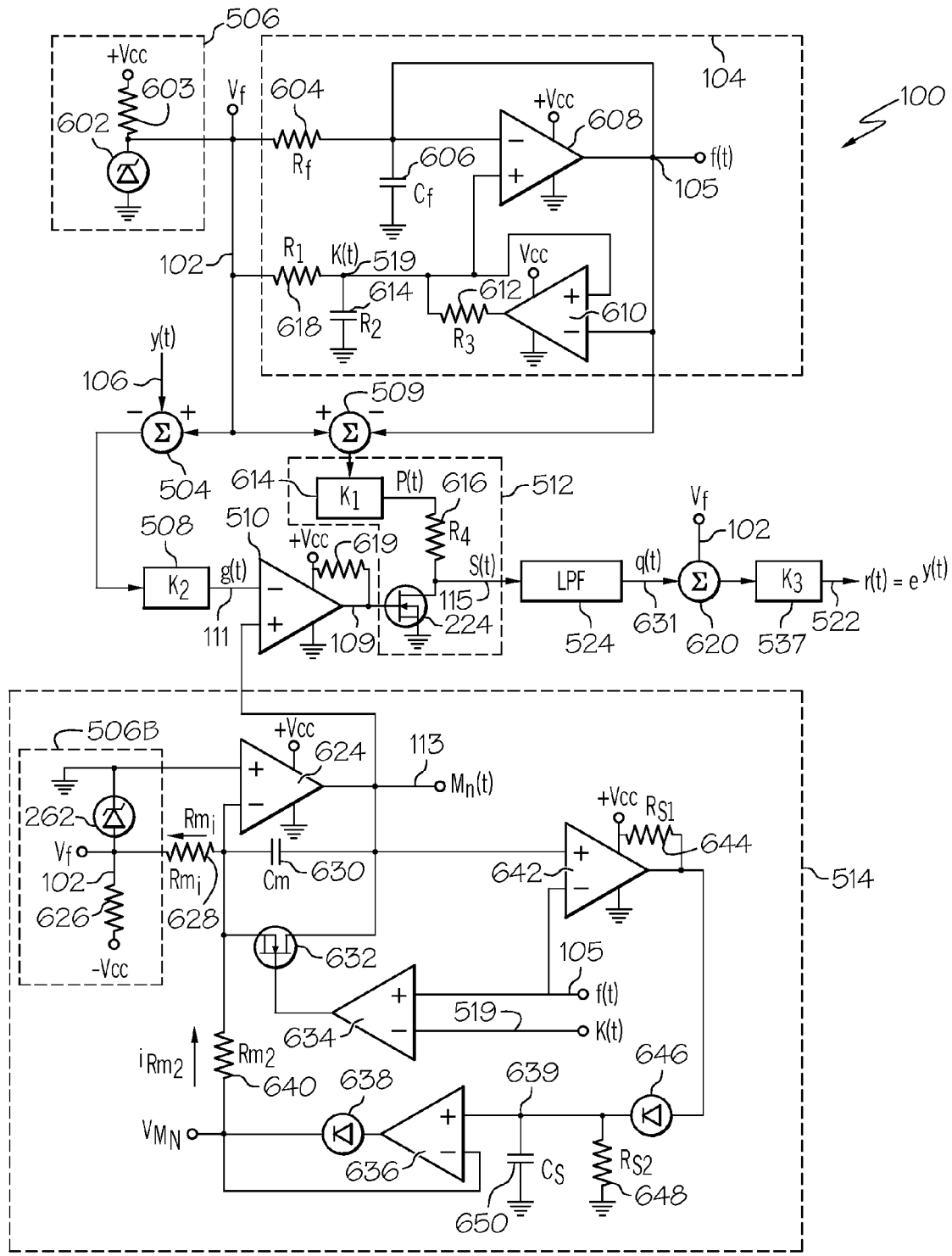
FIG. 2 is a circuit diagram of an exemplary anti-logarithmic amplifier.

FIG. 2 describes an analog circuit implementation of an anti-logarithmic amplifier 100 that generally parallels operation and layout described in FIG. 1 above. With reference now to FIG. 2, the amplifier suitably includes a reference signal 102, various function generating modules 104, 512 and 514, and a low-pass filter 524 that produces an anti-logarithmic output signal 522 in response to an input signal 106.

Reference signal 102 (also referenced herein as $V_f$) is suitably produced by any accurate voltage or current source, or other reference source generator 506. In various embodiments, reference signal 102 is produced in response to a battery, rail or other reference voltage ($V_{cc}$). This reference input may be regulated by, for example, coupling a precision shunt reference 202 in parallel to the signal load, although this feature is not included in all embodiments.

In the embodiment shown in FIG. 2, module 104 includes two comparators 608, 610 coupled to receive reference signal 102 via a resistor 604 and capacitor 606 to create the exponential wave shape in signal 105. Various resistors $R_1$ 613, $R_2$ 614 and $R_3$ 612 are also provided to bias the operation of comparators 608, 610 as appropriate, resulting in a signal 105 with a periodic exponential waveform. Function generator 104 therefore produces a periodic exponential waveform 105 from the reference signal 102 in response to an RC rise time produced by resistor 604 and capacitor 606. This exponential waveform 105 (also referenced herein and in the drawing figures as signal "f(t)") is generally produced by the interaction of comparators 608 and 610 with resistors $R_3$ 612, $R_2$ 614 and $R_1$ 618, as well as resistor $R_f$ 604 and capacitor $C_f$ 606.

Assuming momentarily that the output of comparator 610 is initially zero, the voltage on signal 105 is shown through simple application of Ohm's law to be:

$$f_1 = V_f \frac{R_2 R_3}{R_1 R_2 + R_1 R_3 + R_2 R_3} \quad (1)$$

If $R_3$ is designed to be much smaller than $R_1$ and $R_2$ (which is not necessary in all embodiments, but which simplifies the mathematics for this description), Equation (1) simplifies such that $f_1$ is approximately zero. Applying similar analysis when the output of comparator 610 is open, signal 105 will be given by Equation (2):

$$f_2 = V_f \frac{R_2}{R_1 + R_2} \quad (2)$$

During the interval between Equations (1) and (2), the current in resistor 604 can be expressed as:

$$i_f = \frac{V_f - f(t)}{R_f} = C_f \frac{df(t)}{dt} \quad (3)$$

which can be readily solved for 0<t<T to:

$$f(t) = V_f \left(1 - e^{\frac{-t}{R_f C_f}}\right) \quad (4)$$

Figure 3:
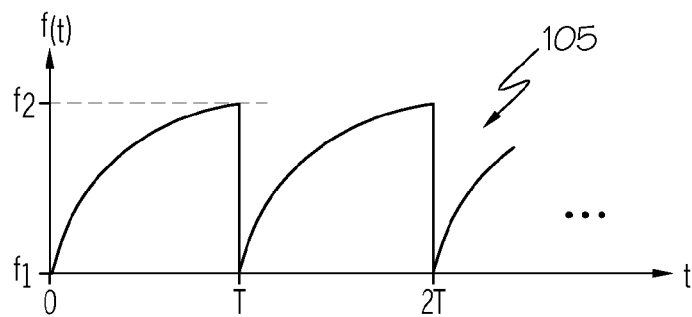
FIG. 3 is a plot of an exemplary voltage characteristic generated as part of an exemplary anti-logarithmic amplifier.

An exemplary plot of the resulting periodic exponential increase in the magnitude of signal 105 from $f_1$ to $f_2$ is shown in FIG. 3. Additionally, if resistor 614 is designed to be much greater than resistor 618 for simplicity, it can be readily shown from Equations (2) and (4) that the period (T) is expressed by:

$$T \approx -R_f C_f \ln \frac{R_1}{R_2} \quad (5)$$

In addition to obtaining exponential signal 104 from module 113, the signal k(t) produced at node 519 of function generator 104 can be of interest in various embodiments. Signal 519 can be used, for example, as a "reset" signal that indicates when the exponential signal 105 reaches the end of its period (T). For this reason, in many embodiments, module 104 can be considered to be a "dual function" generator (as shown in FIG. 1) that produces both periodic exponential waveform 105 and reset signal 519. As evidenced by the circuitry of function generator 104 shown in the example of FIG. 2, however, the actual components used to generate the two signals 104 and 519 can have substantial overlap, and need not be separately provided in two distinct modules or circuits.

Figure 4:
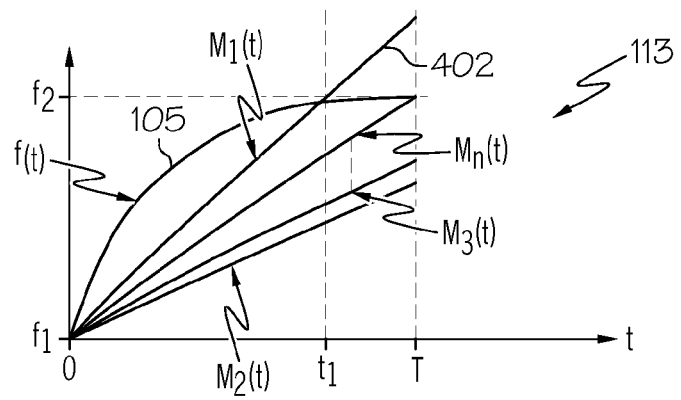
FIG. 4 is a plot of an exemplary voltage characteristic generated as part of an exemplary anti-logarithmic amplifier.

Generally speaking, it is desirable to create a signal m(t) that is generally linear in shape, with a signal slope such that the waveform linearly (or approximately linearly) increases from the minimum value ($f_1$) to the maximal value ($f_2$) of signal 105, and that reaches the $f_2$ value at the same time that the exponential signal 105 reaches this value. That is, to create a ramp waveform 113 that has substantially the same period (T) and amplitude as exponential waveform 105. "Substantially" in this context means that some variation and deviation is intended to occur during operation, as described more fully below, and that the periods and amplitudes of signals 105 and 113 may not match $f_1$ and $f_2$ exactly at all times, even though the general intent is to create a ramp signal 113 with period and maximum magnitude corresponding to those of signal 105. Various examples of ramp signal 113 are shown in FIG. 4, with each signal 113 having a slightly different slope than the others.

In the exemplary embodiment of FIG. 2, function generator 514 creates signal m(t) (i.e. signal 113) using various comparators 634 and 642 and op-amps 624 and 636 in conjunction with resistors 628 and 640, capacitor 630, and switching element 632 (which may be a FET or other transistor). Various other components such as resistors 626, 644, 648, capacitor 650 and/or diodes 638 and 646 are also provided to generate the desired waveform in this example.

In the embodiment shown in FIG. 2, the current flowing through capacitor $C_m$ 630 is generally equal to the difference in the currents flowing through resistors $R_{m1}$ 628 and $R_{m2}$ 640. Through simple application of well-known physics governing electrical circuits, it can be shown for the current in capacitor 630:

$$i_{cm}(t) = \frac{V_f}{R_{m1}} - \frac{V_{M_n}}{R_{m2}} = C_m \frac{dm_n(t)}{dt} \quad (6)$$

Equation (6) can be rearranged and solved for the voltage at node 113 (i.e. for signal m(t)) as follows:

$$m_n(t) = \frac{1}{C_m} \int_0^t dt' \left(\frac{V_f}{R_{m1}} - \frac{V_{M_n}}{R_{m2}}\right) = \frac{1}{C_m} \left(\frac{V_f}{R_{m1}} - \frac{V_{M_n}}{R_{m2}}\right) \cdot t \quad (7)$$

In Equation (7), the rightmost result is obtained because, as shown more fully below, $V_{Mn}$ is relatively constant over the period T.

In operation, function generator 514 suitably creates signal 113 from reference signal 102 (shown provided by a second reference signal circuit 506B, although circuit 506 could provide this reference in other embodiments). Initially, the voltage on capacitors 630 and 650 is very low (or zero), meaning that voltage $V_{Mn}$ 639 is also low (or zero). Because the exponential signal f(t) initially rises faster than the ramp signal m(t), comparator 642 initially provides a low voltage output, maintaining little or no charge on capacitor 650, and the voltage at node 639 at or near zero. Until the values of signals 105 and 113 are equal, then, signal 113 is described by the equation:

$$m_1(t) = \frac{1}{C_m} \int_0^t dt' \frac{V_f}{R_{m1}} = \frac{V_f}{R_{m1} C_m} \cdot t \quad (8)$$

Note that Equation (8) describes a linear signal 113 having a ramp waveform during this time period, since $V_f$, $R_{m1}$ and $C_m$ are each constant values.

When the magnitude of signal 113 exceeds the magnitude of exponential signal 105, comparator 642 begins charging capacitor 650 through resistors 644 and 648. This charging on capacitor 650 increases the voltage at node 639, increasing voltage $V_{M1}$, which in turn decreases the rate at which capacitor 630 charges. As a result, signal 113 becomes slightly non-linear to correct for the "overshoot" in the value of signal 113 with respect to signal 105. When signal 113 is described as "substantially linear", then, it will be appreciated that some non-linearity will nevertheless exist to provide for overshoot correction. This non-linearity can be observed in FIG. 4 in line $m_1(t)$, in which the ramp waveform 113 equals the logarithmic waveform 105 at time $t_1$, and exceeds waveform 113 for the remainder of the signal period (T), indicated as overshoot 402. When the reset signal 519 indicates the end of a signal period (T) in exponential waveform 105, however, comparator 634 activates switching element 632, which appropriately resets capacitor 630. In the embodiment shown, capacitor 630 is reset by tying both sides of the capacitor together; in alternate embodiments, one or more sides of the capacitor can be tied to a reference voltage (e.g. ground) for an appropriate time to remove charge stored on the capacitor, or any other technique may be used.

During subsequent periods of exponential waveform 105, the voltage of node 639 continues to adjust until the magnitude of ramp signal 113 is equal to (or slightly greater) than the magnitude of exponential signal 105 at the end of the signal period (T). Ramp signal 113 may maintain a slight upward concavity due to the gradual discharge of capacitor 640; if the RC time constant created by resistor 648 and capacitor 650 is designed to be greater than the period of the signals, however, this concavity will be relatively slight in comparison to the linear portion of ramp signal 113, and can be ignored for purposes of "substantial linearity". The result of this adjustment is a ramp signal 113 with a magnitude and a signal period substantially equal to those of exponential signal 105. Ramp signal 113, then, becomes synchronized to exponential waveform 105. Ramp signal 113 may be created by any number of equivalent techniques or circuits in addition to those described here. The signal could be created with any conventional digital-to-analog circuitry, for example. Additionally, ramp signal 113 may be generated with any equivalent waveform (e.g. a sawtooth waveform, a series of pulses having increasing magnitudes, and/or the like), and need not be a traditional analog ramp in all embodiments.

Thus, when ramp signal 113 has stabilized, it will have a maximum magnitude and period substantially equal to those of exponential signal 105. As best seen in FIG. 4, this magnitude will be equal to the difference between the maximum and minimum values of the ramp (e.g. $f_2-f_1$), and the signal period is simply T. As a result, the slope of line 113 in FIG. 4 is simply $f_2-f_1/T$, which simplifies to $f_2/T$ in this example (since $f_1$ is set to zero). Setting this relationship equal to the slope value given in Equation (7) above, and then substituting from Equations (2) and (5), ramp signal 113 can be represented as:

$$m(t) = \left(\frac{V_f}{R_{m1}C_m} - \frac{V_{M_n}}{R_{m2}C_m}\right) \cdot t = \frac{f_2}{T} \cdot t = \frac{V_f R_2}{R_1 + R_2}\left(\frac{-1}{R_f C_f \ln\frac{R_1}{R_2}}\right) \cdot t \quad (9)$$

Figure 5:
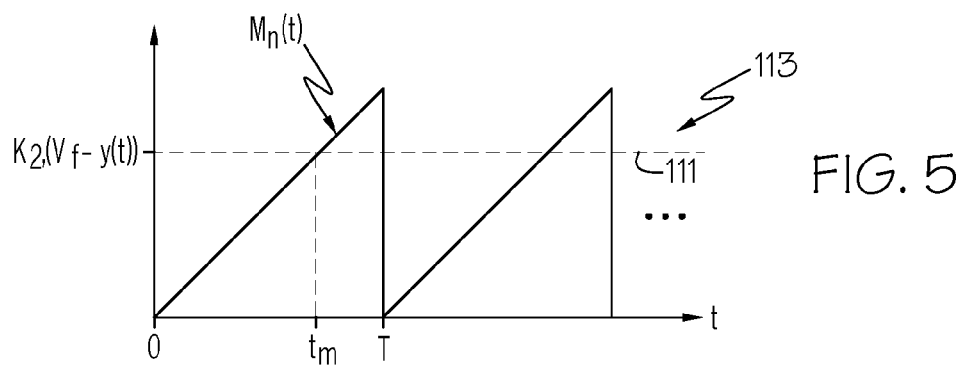
FIG. 5 is a plot of an exemplary voltage characteristic generated as part of an exemplary anti-logarithmic amplifier.

Ramp signal 113 is provided to comparator 510 along with a scaled representation 111 of input signal 106. Scaled representation 111 may be formed in any manner. In the exemplary embodiment of FIG. 2, for example, scaled representation 111 is formed as the difference of reference signal 102 and input signal 106, which is then scaled by optional scaling block 508. Scaling block 508 may be any sort of amplifier, attenuator, voltage divider, and/or the like, or may be omitted entirely in other embodiments. Other representations using any sort of scaling, signal combination or other techniques may be used in alternate embodiments. Since signal 111 generally varies relatively slowly with respect to signal 105, it can be considered for present purposes to act as a constant, shown as line 111 in FIG. 5. The scaled representation 111 of input signal 106 presented in FIG. 2 can be readily shown to be a function of input signal y(t) 106 as follows:

$$g(t)=(V_f-y(t))\cdot k_2 \quad (10)$$

Function generator 512 in FIG. 2 is any circuitry or other logic that produces a hybrid signal 115 (also shown as s(t)). As shown in FIG. 2, function generator 512 suitably includes a switching element (e.g. a FET or other transistor) 224 configured as shown driven by a comparator 510. In this embodiment, comparator 510 provides a difference output 109 that represents the difference between scaled representation 111 and ramp signal 113. When ramp signal 113 exceeds scaled representation 111, comparator 510 suitably activates switching element 224 (which may be a field effect transistor (FET), any other type of transistor, and/or the like) to short the input of filter 524 to ground (or another appropriate reference). When ramp signal 113 does not exceed scaled representation 111, pull up resistor 619 activates switching element 224 to tie signal 115 to ground/null as appropriate. In equivalent embodiments, however, signal 115 may be generated in any other manner. With momentary reference to FIG. 5, switching element 224 is activated at time $t_m$, which corresponds to the time that ramp signal 113 becomes equal to scaled representation 111. It can therefore be readily shown that at time $t_m$:

$$m_n(t_m) = k_2(V_f - y(t_m)) = \frac{V_f R_2}{R_1 + R_2}\left(\frac{-t_m}{R_f C_f \ln\frac{R_1}{R_2}}\right) \quad (11)$$

Assuming for simplicity that $k_2$ scaling block 508 is designed based upon the relatively constant values of $V_f$, $R_1$, $R_2$ and $$\left|\ln\frac{R_1}{R_2}\right|,$$

the effects of such components on signal 111 can be negated. Also, if $R_1$ is designed to be much less than $R_2$, it can be readily shown that $$\ln\frac{R_1}{R_2} = -\left|\ln\frac{R_1}{R_2}\right|.$$

Equation (11) can therefore be rearranged and solved for time $t_m$ as follows:

$$t_m=R_f C_f(V_f-y(t_m)) \quad (12)$$

Figure 6:
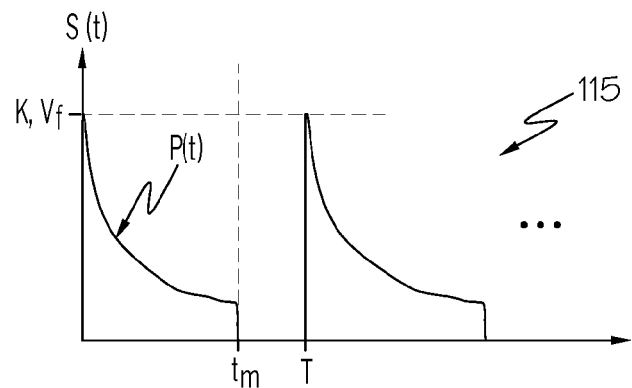
FIG. 6 is a plot of an exemplary voltage characteristic generated as part of an exemplary anti-logarithmic amplifier.

For that portion of the signal period (T) prior to time $t_m$, waveform generator 512 applies a signal 115 based upon exponential waveform 105 to filter 524. An example of the hybrid waveform 115 applied to filter 524 by waveform generator 512 is shown in FIG. 6. As shown therein, a waveform that is based upon exponential signal 105 is applied prior to time $t_m$, after which switching element 224 shorts the signal to ground (or another reference voltage) in response to the output of comparator 510. In the embodiment shown in FIG. 2, exponential signal 104 is subtracted from reference signal 102 and appropriately scaled by scaling block 614, although this particular signal processing can be omitted or altered in other embodiments. Stated mathematically (and by substitution of Equation (4) above), the hybrid signal p(t) 115 applied to filter 524 prior to time $t_m$ is:

$$p(t) = (V_f - f(t)) \cdot k_1 = k_1 V_f e^{\frac{-t}{R_f C_f}} \quad (13)$$

Filter 524 is designed as any low pass filter capable of removing harmonics of signal 115 and providing the DC components of that signal as an output. Filter 524 is generally designed to have a relatively high input impedance with respect to resistance 616 and to exhibit a cutoff frequency less (and potentially much less) than the frequency (1/T) of signal 115. As a result, the output 631 of filter 524 is simply the direct current (DC) component of hybrid signal 115. When non-DC components of signal 115 are removed, the resulting output 631 of filter 524 can be represented as:

$$q(t) = \frac{1}{T} \int_0^{t_m} dt' \, p(t') \quad (14)$$

Substituting Equation (5) for period T, Equation (12) for time $t_m$, and Equation (13) for p(t) into Equation (14), it can be readily shown that:

$$q(t) = \frac{-k_1 V_f}{R_f C_f \ln \frac{R_1}{R_2}} \int_0^{t_m} dt' \, e^{\frac{-t'}{R_f C_f}} = \frac{k_1 V_f}{\left| \ln \frac{R_1}{R_2} \right|} (1 - e^{y(t) - V_f}) \quad (15)$$

Note that in the rightmost term of Equation (15), the values of $R_f$ and $C_f$ have cancelled, indicating that the temperature-dependent effects of resistor 204 and capacitor 206 have been negated. As a result, the logarithmic characteristic provided at the output 120 can be shown to vary solely as a logarithmic function of the input signal 106. Because the rightmost term of Equation (14) is primarily made up of constant values $V_f$, $R_1$ and $R_2$, these scalar values can be eliminated by simply designing appropriate scaling blocks 614 and 637, and then subtracting signal 601. In this example, an output signal 522 results that is simply the exponentiated (i.e. anti-logarithmic) input signal 502, without regard to the temperature dependent effects of the resistor-capacitor time constant. Stated mathematically:

$$r(t) = e^{y(t)} \quad (16)$$

Various embodiments of the anti-log amplifiers described herein may be implemented using conventional discrete components such as resistors, capacitors, transistors, comparators and/or operational amplifiers. This allows for convenient and low-cost design, and also allows a great level of flexibility as compared to amplifiers based upon characteristics of a P-N junction. And, by applying the concepts described herein, the adverse temperature effects typically associated with R-C circuitry can be reduced or eliminated, thereby providing a further benefit of many embodiments.

Figure 7:
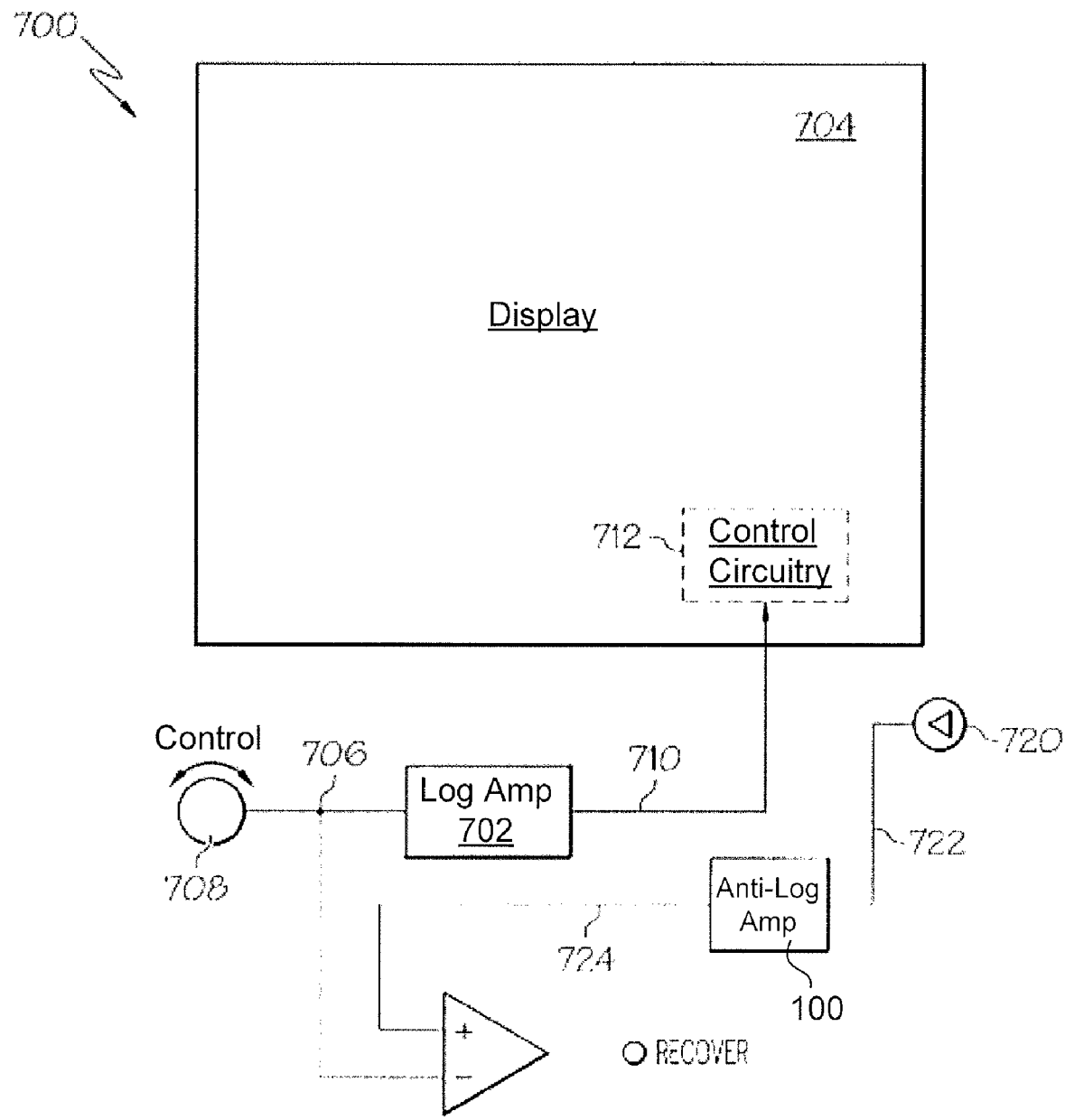
FIG. 7 is a block diagram of an exemplary display system that includes an anti-logarithmic amplifier.

The exponential/anti-logarithmic amplifiers described herein may be used for any purpose, such as any type of electrical or electronic circuitry. As noted at the outset, logarithmic and anti-logarithmic amplification circuits can be useful in many audio and visual applications, for example, where it can be desirable to provide fine control at low amplitudes (e.g. low brightness, low volume, etc.) while permitting coarser control at greater amplitudes. FIG. 7, for example, shows a display system 700 that includes a logarithmic amplifier 702 providing a logarithmic transfer function between a control device 708 (e.g. a knob, slider, or the like) and a display 704 for controlling lamp brightness, contrast, or some other characteristic of display 704. Typically, control device 702 is associated with a potentiometer or the like to produce a voltage signal 706 that varies linearly or otherwise as the control device is adjusted. Amplifier 702 adjusts this input 706 to provide the logarithmic drive signal 710 to parameter control circuitry 712 (e.g. brightness control circuitry) associated with display 704. Although any logarithmic amplifier could be used, an example of one logarithmic amplifier is provided in U.S. patent application Ser. No. 11/756,002 entitled "Logarithmic Amplifier" and filed on May 31, 2007. An anti-logarithmic amplifier 100 can be used to recover a signal 724 that can be compared against the original input signal 706 to verify proper operation, and/or for other purposes as appropriate. In the example shown in FIG. 7, lamp brightness is indicated by a signal 722 provided from a photodiode or other sensor 720 capable of measuring the adjusted parameter of display 704. The anti-logarithmically amplified signal 724 obtained from amplifier 100 can therefore be compared against the originally-provided control signal 706 to identify performance issues or the like. Again, logarithmic and anti-logarithmic circuits may be deployed in any number of equivalent applications and environments.

While the invention has been described with reference to an exemplary embodiment, various changes may be made and many different equivalents may be substituted for elements thereof without departing from the scope of the invention. In addition, many modifications may be made to adapt to a particular situation or material to the teachings of the invention without departing from the scope thereof. It is therefore intended that the invention not be limited to any particular embodiment disclosed herein, but rather that the invention will include all embodiments falling within the scope of the appended claims and the legal equivalents thereof.

What is claimed is:

1. An anti-logarithmic amplifier configured to produce an anti-logarithmic output signal that is an anti-logarithmic function of an input signal, the anti-logarithmic amplifier comprising:

a first function generator configured to produce a periodic exponential waveform based upon a resistor-capacitor time constant, the periodic exponential waveform having a period and a magnitude, wherein the magnitude of the periodic exponential waveform exponentially increases from a minimum value to a maximum value in each period;

a second function generator configured to produce a ramp waveform from the periodic exponential waveform, wherein the ramp waveform has a ramp signal period substantially equal to the period of the periodic exponential waveform and a ramp magnitude substantially equal to the magnitude of the periodic exponential waveform at an end of the ramp signal period;

a third function generator configured to produce a hybrid waveform in response to the ramp waveform, the hybrid waveform having a signal period, and wherein the hybrid waveform comprises a first portion having a first waveform for a first time period and a second portion having a second waveform different from the first waveform for a remainder of the signal period, and wherein a duration of the first time period is determined in response to the ramp waveform; and a low pass filter configured to receive the hybrid waveform and to produce the anti-logarithmic output signal as a function of the hybrid waveform.

2. The anti-logarithmic amplifier of claim 1 wherein the first function generator is further configured to provide a reset signal having a reset period substantially equal to the period of the periodic exponential waveform.

3. The anti-logarithmic amplifier of claim 2 wherein the second function generator is further configured to reset the ramp waveform in response to the reset signal.

4. The anti-logarithmic amplifier of claim 1 wherein the first waveform of the hybrid waveform is based at least in part upon the periodic exponential waveform.

5. The anti-logarithmic amplifier of claim 4 wherein the second waveform of the hybrid waveform comprises a substantially constant value.

6. The anti-logarithmic amplifier of claim 5 comprising a comparator configured to compare the ramp waveform to the input signal and wherein the third function generator is further configured to respond to the comparator to switch the hybrid waveform between the first waveform and the second waveform when the ramp waveform exceeds the representation of the input signal.

7. The anti-logarithmic amplifier of claim 1 wherein the first function generator comprises a first comparator coupled to a reference signal via a resistor and a capacitor to thereby produce the resistor-capacitor time constant.

8. The anti-logarithmic amplifier of claim 1 wherein the second function generator is further configured to adjust the slope of the ramp waveform when the ramp waveform exceeds the periodic exponential waveform.

9. The anti-logarithmic amplifier of claim 1 wherein the exponential waveform is generated from a reference signal.

10. A display system comprising the anti-logarithmic amplifier of claim 1.

11. A method of producing an output signal that is an anti-logarithmic function of an input signal, the method comprising the steps of:

generating a periodic exponential waveform with a resistor-capacitor time constant, the periodic exponential waveform having a period;

producing a hybrid waveform based upon the exponential waveform and a ramp waveform, wherein the hybrid waveform has a signal period substantially equal to the period of the exponential waveform, wherein the hybrid waveform comprises a first portion having a first waveshape and a first duration determined as a function of the input signal, and a second portion having a second waveshape different from the first waveshape, and wherein the second portion extends for the remainder of the signal period following the first duration; and filtering the hybrid waveform to thereby extract the anti-logarithmic output signal.

12. The method of claim 11 wherein the filtering step comprises low-pass filtering the pulsed waveform to remove harmonic components of the hybrid waveform.

13. The method of claim 11 further comprising the step of generating the ramp waveform having a maximum amplitude substantially equal to the maximum amplitude of the exponential waveform and a ramp period substantially equal to the period of the exponential waveform.

14. The method of claim 13 further comprising the step of comparing the ramp waveform to the input signal to thereby determine the first duration of the hybrid waveform.

15. The method of claim 13 wherein the step of generating the ramp waveform comprises adjusting the slope of the ramp waveform when the ramp waveform exceeds the periodic exponential waveform.

16. A display system having the antilogarithmic amplifier of claim 1.

* * * * *